(12) United States Patent
Yuasa

(10) Patent No.: US 7,030,009 B2
(45) Date of Patent: Apr. 18, 2006

(54) METHOD FOR FORMING METAL INTERCONNECT IN A CARBON CONTAINING SILICON OXIDE FILM

(75) Inventor: Hiroshi Yuasa, Kyoto (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/942,953

(22) Filed: Sep. 17, 2004

(65) Prior Publication Data

US 2005/0032358 A1   Feb. 10, 2005

Related U.S. Application Data

(62) Division of application No. 10/695,804, filed on Oct. 30, 2003, now Pat. No. 6,815,341, which is a division of application No. 09/790,518, filed on Feb. 23, 2000, now abandoned.

(30) Foreign Application Priority Data

Feb. 23, 2000  (JP) .............................. 2000-045504

(51) Int. Cl.
*H01L 21/4763* (2006.01)
(52) U.S. Cl. ...................... 438/637; 438/675
(58) Field of Classification Search ............... 438/618, 438/623, 637–640, 675; 430/313, 316
See application file for complete search history.

(56) References Cited

U.S. PATENT DOCUMENTS

| 5,424,246 | A | 6/1995 | Matsuo et al. |
| 6,037,664 | A * | 3/2000 | Zhao et al. ................ 257/758 |
| 6,042,999 | A | 3/2000 | Lin et al. |
| 6,150,073 | A * | 11/2000 | Huang ........................ 430/313 |
| 6,194,128 | B1 | 2/2001 | Tao et al. |
| 6,242,339 | B1 | 6/2001 | Aoi |
| 6,319,809 | B1 | 11/2001 | Chang et al. |
| 6,333,258 | B1 | 12/2001 | Miyata et al. |
| 6,350,670 | B1 | 2/2002 | Andedih et al. |
| 6,365,528 | B1 | 4/2002 | Sukharev et al. |
| 6,472,755 | B1 | 10/2002 | Ngo et al. |
| 6,479,380 | B1 | 11/2002 | Furusawa et al. |
| 6,683,002 | B1 | 1/2004 | Chooi et al. |
| 2002/0034874 | A1 | 3/2002 | Aoki |
| 2002/0155695 | A1 | 10/2002 | Lee et al. |

FOREIGN PATENT DOCUMENTS

| JP | 01-319942 | 12/1989 |
| JP | 6-216116 | 8/1994 |

(Continued)

OTHER PUBLICATIONS

S. Wolf et al., "Silicon Processing for the VLSI Era", vol. 1, 1986 Lattice Press, p. 184.
Notice of Reasons of Rejection Dated Mar. 30, 2004.

*Primary Examiner*—Anh Duy Mai
(74) *Attorney, Agent, or Firm*—Donald R. Studebaker; Nixon Peabody, LLP (57) ABSTRACT

An insulating film is formed of a carbon-containing silicon dioxide film on a semiconductor substrate. In the insulating film, an interconnect groove is formed. A silicon dioxide layer with a density high enough to allow almost no oxygen to pass therethrough is formed on the bottom and side faces of the interconnect groove. And a metal interconnect is formed on the silicon dioxide layer inside the interconnect groove.

6 Claims, 11 Drawing Sheets

FOREIGN PATENT DOCUMENTS

| | | |
|---|---|---|
| JP | 9-275138 | 10/1997 |
| JP | 10-022473 | 1/1998 |
| JP | 10-209272 | 8/1998 |
| JP | 11-87503 | 3/1999 |
| JP | 11-087503 | 3/1999 |
| JP | 11-297829 | 10/1999 |
| JP | 2000-58642 | 2/2000 |
| JP | 2002-26121 | 1/2002 |

* cited by examiner

METHOD FOR FORMING METAL INTERCONNECT IN A CARBON CONTAINING SILICON OXIDE FILM

BACKGROUND OF THE INVENTION

The present invention relates to a semiconductor device, including metal interconnects laid in an insulating film with a low dielectric constant (which will be herein called a low-dielectric-constant film), and also relates to a method for fabricating the same.

Hereinafter, the structure of a semiconductor device, including inlaid metal interconnects in a low-dielectric-constant film, will be described with reference to FIG. 6.

Figure 6:
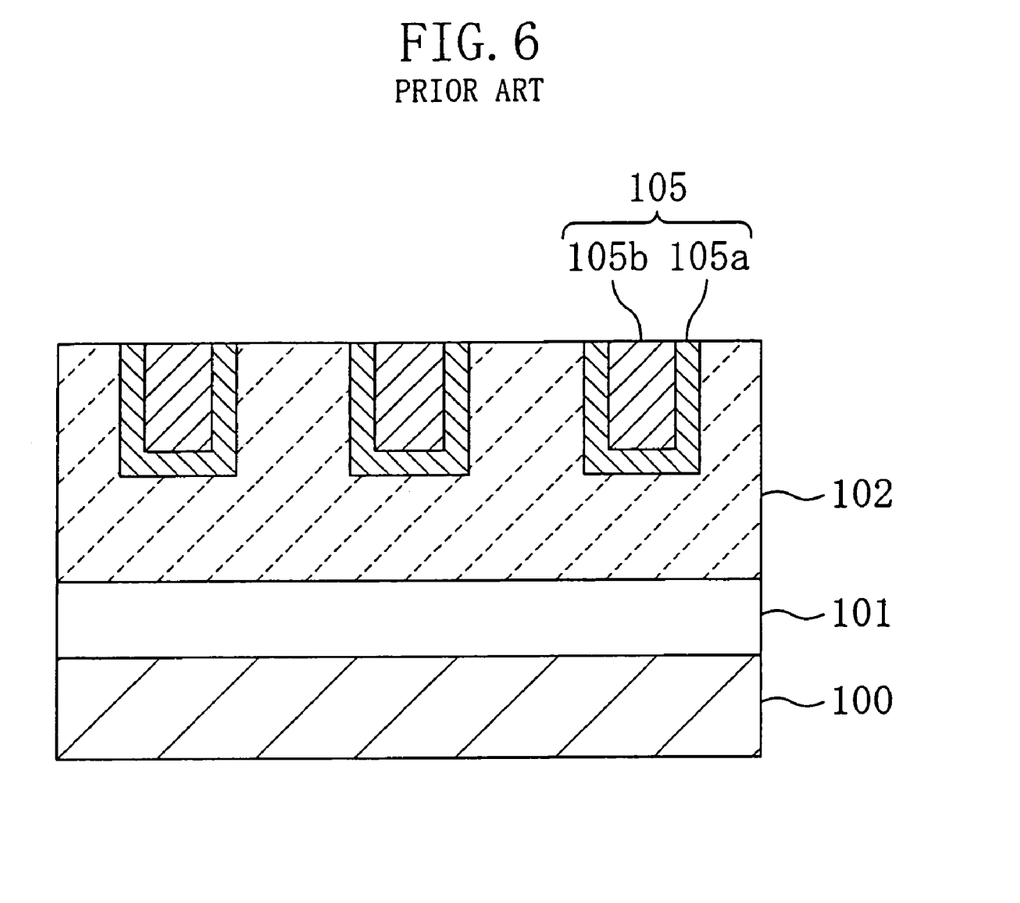
FIG. 6 is a cross-sectional view of a known semiconductor device.

As shown in FIG. 6, a second insulating film 102 is formed of a silicon dioxide film, for example, on a first insulating film 101 deposited on a semiconductor substrate 100. In the second insulating film 102, metal interconnects 105 have been formed. Specifically, each of the metal interconnects 105 consists of a barrier metal layer 105a of tantalum nitride, for example, and a main interconnect layer 105b of copper, for instance.

In this semiconductor device, the second insulting film 102, which exists between the metal interconnects 105, is made of silicon dioxide with a dielectric constant between about 3.9 and about 4.2. Therefore, a parasitic capacitance, generated between the metal interconnects 105, increases, thereby interfering with high-speed operation of the semiconductor device.

To solve this problem, a carbon-containing silicon dioxide film with a low dielectric constant of about 2.5 may be used as the second insulating film 102.

Hereinafter, a method for fabricating a semiconductor device, including inlaid metal interconnects formed in an insulating film of carbon-containing silicon dioxide, will be described with reference to FIG. 7A through FIG. 7E.

Figure 7A:
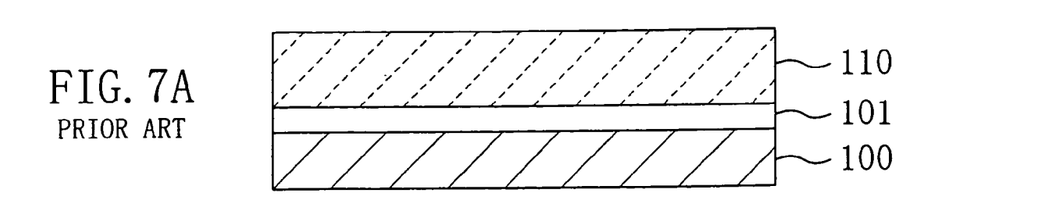
FIGS. 7A through 7E are cross-sectional views illustrating respective process steps for fabricating another known semiconductor device.
Figure 7B:
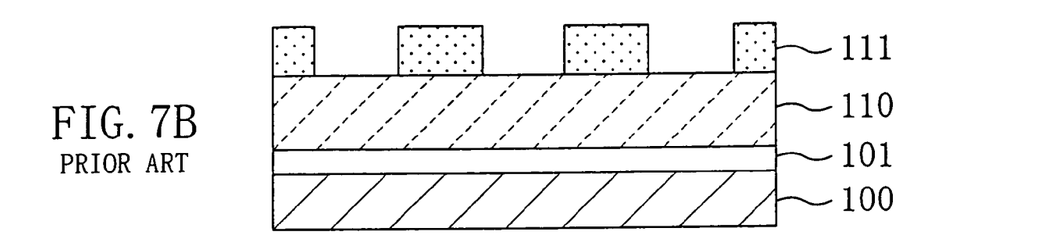

First, as shown in FIG. 7A, a second insulating film 110 of carbon-containing silicon dioxide, is deposited on a first insulating film 101 formed on a semiconductor substrate 100. Then, a resist pattern 111 with openings for forming interconnect grooves is defined on the second insulating film 110 as shown in FIG. 7B.

Figure 7C:
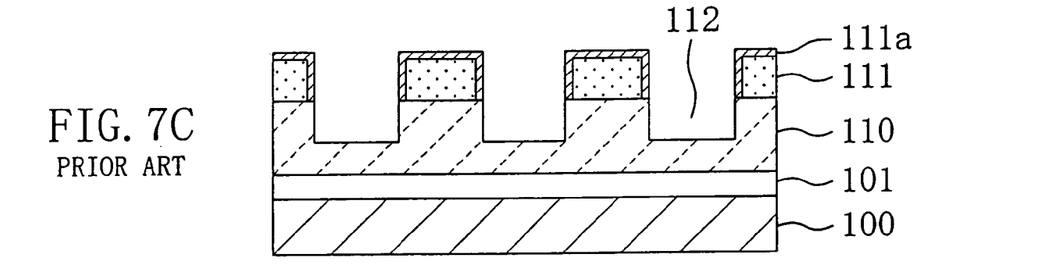

Next, as shown in FIG. 7C, the second insulating film 110 is plasma-etched using an etching gas, consisting essentially of fluorine and carbon, and being masked with the resist pattern 111. In this manner, interconnect grooves 112 are formed in the second insulating film 110. As a result, the upper part of the resist pattern 111 changes into a cured layer 111a. Specifically, the bonding states of atoms in the cured layer 111a are different from those of atoms in the original material of the resist pattern 111 that has not yet been plasma-etched. And the cured layer 111a is made of a polymer consisting essentially of fluorine and carbon and has a thickness of about 50 nm. The cured layer 111a cannot be removed by a wet etching process but can be removed by a plasma etching process using oxygen gas.

Figure 7D:
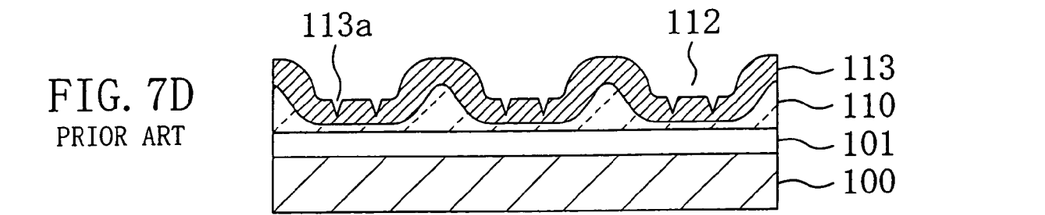

Accordingly, the resist pattern 111 is ashed away with oxygen plasma as shown in FIG. 7D. In this case, the ashing process is performed by a down flow technique (in which no bias voltage is applied to the substrate) in a vacuum between about 267 Pa and about 400 Pa, for example, and with the substrate heated to a relatively high temperature between about 150° C. and about 250° C., for instance. In this manner, the resist pattern 111 with the cured layer 111a in its upper part can be stripped just as intended. Also, a silicon dioxide film 113 with a thickness of 200 nm, for example, is formed in the upper part of the second insulating film 110 of carbon-containing silicon dioxide.

In the ashing process using oxygen plasma, carbon is removed from the carbon-containing silicon dioxide for the second insulating film 110, thereby producing silicon dioxide. Hereinafter, this mechanism will be described with reference to FIGS. 8 and 9.

Figure 8:
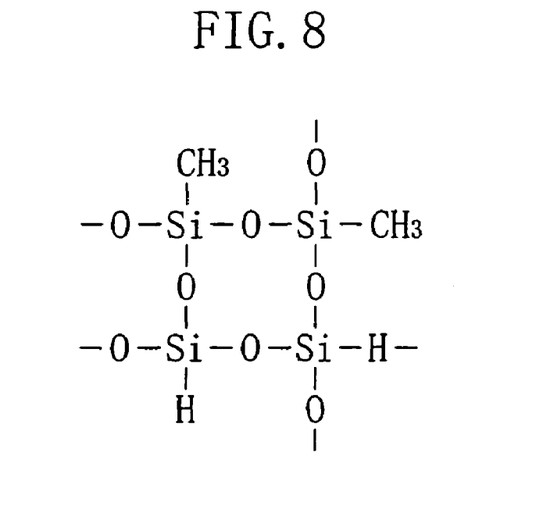
FIG. 8 illustrates an example of a chemical formula representing a carbon-containing silicon dioxide.
Figure 9:
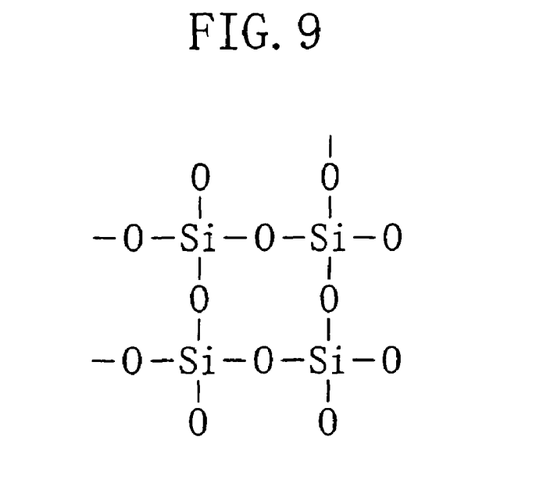
FIG. 9 illustrates a chemical formula representing a silicon dioxide obtained when oxygen and a carbon-containing silicon dioxide are bonded together.

FIG. 8 illustrates an example of a chemical formula representing a carbon-containing silicon dioxide. If the carbon-containing silicon dioxide represented by this chemical formula and oxygen are bonded together, the following chemical reaction occurs. Then, $CH_3$, which has been bonded to Si, disappears. That $CH_3$ disappeared is replaced with O to form $SiO_2$ bonds. Therefore, a silicon dioxide as represented by the chemical formula shown in FIG. 9 is produced.

Figure 7E:
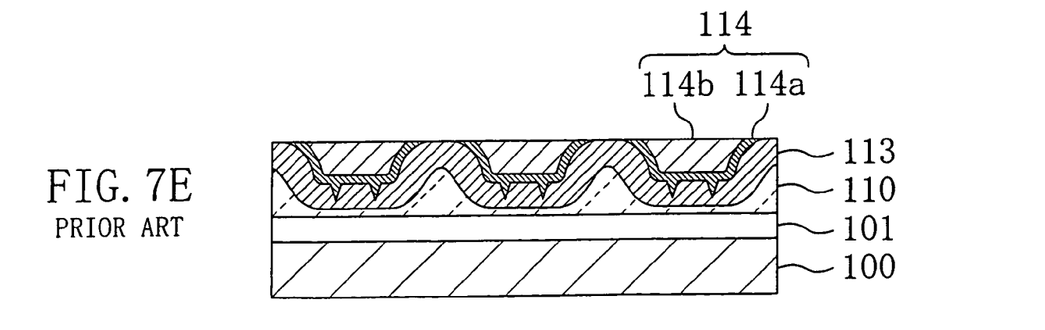

Next, a tantalum nitride film is deposited over the second insulating film 110, or on the silicon dioxide film 113 more exactly, by a sputtering process. And then, a copper film is deposited on the tantalum nitride film by an electroplating process. Thereafter, excessive parts of the copper and tantalum nitride films, existing over the second insulating film 110, are removed by a CMP process, thereby defining metal interconnects 114 as shown in FIG. 7E. The metal interconnects 114 are made up of a barrier metal layer 114a of tantalum nitride and a main interconnect layer 114b of copper.

However, the semiconductor device formed in this manner has the following problems.

First of all, in the step of ashing away the resist pattern 111 using oxygen plasma, the silicon dioxide film 113 is adversely formed in the upper part of the second insulating film 110 of carbon-containing silicon dioxide. Specifically, the silicon dioxide film 113 exhibits a high dielectric constant and has a thickness of 200 nm, for example. Therefore, although the carbon-containing silicon dioxide film is used as the second insulating film 110, a parasitic capacitance generated between the metal interconnects 114 cannot be reduced sufficiently.

Also, the silicon dioxide film 113 has a density between 1.7 $g/cm^3$ and 1.8 $g/cm^3$, which is lower than that of a silicon dioxide film formed by a plasma CVD process, for instance. Therefore, when oxygen plasma is supplied in a subsequent process step, oxygen ions go through the silicon dioxide film 113 to reach and oxidize the carbon-containing silicon dioxide film under the film 113. As a result, the silicon dioxide film 113 has its film thickness increased undesirably. This phenomenon is observed, for example, in the subsequent process step of ashing away a resist pattern for forming via holes over the metal interconnects 114. The phenomenon is also observed, for instance, in the subsequent process step of ashing away a resist pattern for forming interconnect grooves for upper-level metal interconnects to be formed over the via holes.

As described above, in the known semiconductor device including inlaid metal interconnects in an insulating film of carbon-containing silicon dioxide, a thick silicon dioxide film is unintentionally formed in upper parts of the insulting film that surround the metal interconnects. As a result, a parasitic capacitance generated between the metal interconnects increases disadvantageously.

SUMMARY OF THE INVENTION

It is therefore an object of the present invention to enhance the performance of a semiconductor device, including inlaid metal interconnects in an insulating film of carbon-containing silicon dioxide, by reducing a parasitic capacitance produced between the metal interconnects.

To achieve this object, a first inventive semiconductor device includes: an insulating film formed of a carbon-containing silicon dioxide film on a substrate; an interconnect groove formed in the insulating film; a silicon dioxide layer, which is formed on the bottom and side faces of the interconnect groove and has a density high enough to allow almost no oxygen to pass therethrough; and a metal interconnect formed on the silicon dioxide layer inside the interconnect groove.

In the first inventive device, the silicon dioxide layer with a density high enough to allow almost no oxygen to pass therethrough is formed on the bottom and side faces of the interconnect groove. Therefore, even if oxygen plasma is supplied in a subsequent process step, oxygen ions cannot pass through the silicon dioxide layer, and the carbon-containing silicon dioxide film surrounding the silicon dioxide layer is not oxidized. Accordingly, the thickness of the silicon dioxide layer, existing on the bottom and side faces of the interconnect groove, does not increase. As a result, a parasitic capacitance produced between the metal interconnects can be reduced just as intended.

In one embodiment of the first device, the silicon dioxide layer preferably has a density of 2.0 $g/cm^3$ or more.

In such an embodiment, the silicon dioxide layer prevents the oxygen ions from passing therethrough with much more certainty. As a result, it is possible to suppress the increase in thickness of the silicon dioxide layer existing on the bottom and side faces of the interconnect groove.

A second inventive semiconductor device includes: an insulating film formed of a carbon-containing silicon dioxide film on a substrate; an interconnect groove formed in the insulating film; a silicon dioxide layer, which is formed on the bottom and side faces of the interconnect groove and has a small and uniform thickness; and a metal interconnect formed on the silicon dioxide layer inside the interconnect groove.

In the second inventive device, the silicon dioxide layer with a small and uniform thickness is formed on the bottom and side faces of the interconnect groove. In other words, the silicon dioxide layer, existing between the metal interconnects, has a high dielectric constant and a small and uniform thickness. As a result, a parasitic capacitance produced between the metal interconnects can be reduced just as intended.

In one embodiment of the second device, the silicon dioxide layer preferably has a thickness of 20 nm or less.

In such an embodiment, the parasitic capacitance produced between the metal interconnects can be further reduced.

A first inventive method for fabricating a semiconductor device includes the steps of: a) forming an insulating film of a carbon-containing silicon dioxide film on a substrate; b) etching the insulating film using a resist pattern as a mask, thereby forming an interconnect groove in the insulating film; c) performing a dry etching process using an etching gas containing oxygen, thereby removing a cured layer and forming a silicon dioxide layer on the bottom and side faces of the interconnect groove; d) removing the resist pattern by a wet etching process; and e) filling the interconnect groove with a metal film to form a metal interconnect. The cured layer has been formed in an upper part of the resist pattern as a result of the step b).

According to the first inventive method, by performing a dry etching process using an etching gas containing oxygen, a cured layer, formed in an upper part of a resist pattern as a result of the step b), is removed and a silicon dioxide layer is formed on the bottom and side faces of an interconnect groove. Therefore, the bottom and side faces of the interconnect groove are exposed to the etching gas containing oxygen for just a short time. Accordingly, a silicon dioxide layer with a small and uniform thickness is formed on the bottom and side faces of the interconnect groove. Also, the resist pattern having the cured layer removed is stripped by a wet etching process. Therefore, in the step d), the bottom and side faces of the interconnect groove are not exposed to the oxygen plasma, and the thickness of the silicon dioxide layer does not increase. Consequently, it is possible to reduce a parasitic capacitance produced between the metal interconnects just as intended.

In one embodiment of the first method, the dry etching process is preferably performed within a plasma ambient at a pressure of 13.3 Pa or less.

Then, a silicon dioxide layer with a thickness of about 20 nm or less can be formed on the bottom and side faces of the interconnect groove. As a result, the parasitic capacitance produced between the metal interconnects can be further reduced.

In this particular embodiment, the dry etching process is preferably an anisotropic RIE process.

In such an embodiment, a silicon dioxide layer with a thickness of about 20 nm or less and a density high enough to allow almost no oxygen to pass therethrough can be formed on the bottom and side faces of the interconnect groove. Therefore, even if oxygen plasma is supplied in a subsequent process step, oxygen ions cannot pass through the silicon dioxide layer, and a carbon-containing silicon dioxide film surrounding the silicon dioxide layer is not oxidized. Accordingly, the thickness of the silicon dioxide layer, existing on the bottom and side faces of the interconnect groove, does not increase. As a result, the parasitic capacitance produced between the metal interconnects can be reduced just as intended.

In another embodiment, the first inventive method preferably further includes the step of removing the silicon dioxide layer, existing on the bottom and side faces of the interconnect groove, by a wet etching process.

In such an embodiment, the silicon dioxide layer with a high dielectric constant no longer exists between the metal interconnects. As a result, the parasitic capacitance produced between the metal interconnects can be further reduced.

A second inventive method for fabricating a semiconductor device includes the steps of: a) forming an insulating film of a carbon-containing silicon dioxide film on a substrate; b) etching the insulating film using a resist pattern as a mask, thereby forming an interconnect groove in the insulating film; c) filling the interconnect groove with a resist film; d) removing a part of the resist film, existing over the interconnect groove, and the resist pattern with a cured layer by a dry etching process using an etching gas containing oxygen; e) removing the other part of the resist film, still existing inside the interconnect groove, by a wet etching process; and f) filling the interconnect groove with a metal film to form a metal interconnect. The cured layer has been formed in an upper part of the resist pattern as a result of the step b).

In the second inventive method, an interconnect groove is filled with a resist film and then a cured layer, existing in an upper part of a resist pattern, is removed by a dry etching process using an etching gas containing oxygen. Therefore, the bottom and side faces of the interconnect groove, are not exposed to the etching gas containing oxygen, and no silicon dioxide layer is formed thereon. The other part of the resist film, still existing in the interconnect groove, is removed by a wet etching process. Accordingly, the bottom and side faces of the interconnect groove are not exposed to the oxygen plasma, and no silicon dioxide layer is formed thereon in the step e). As a result, a parasitic capacitance produced between the metal interconnects can be reduced just as intended.

In one embodiment, the second inventive method preferably further includes the step of performing an anisotropic RIE process between the steps e) and f) within a plasma ambient containing oxygen at a pressure of 13.3 Pa or less to form a silicon dioxide layer on the bottom and side faces of the interconnect groove.

In such an embodiment, it is possible to form a silicon dioxide layer with a thickness of about 20 nm or less and a density high enough to allow almost no oxygen to pass therethrough on the bottom and side faces of the interconnect groove. Therefore, even if oxygen plasma is supplied in a subsequent process step, oxygen ions cannot pass through the silicon dioxide layer, and a carbon-containing silicon dioxide film surrounding the silicon dioxide layer is not oxidized. As a result, the parasitic capacitance produced between the metal interconnects can be reduced just as intended.

DESCRIPTION OF THE PREFERRED EMBODIMENTS

Embodiment 1

Hereinafter, a semiconductor device according to a first embodiment of the present invention will be described with reference to FIG. 1.

Figure 1:
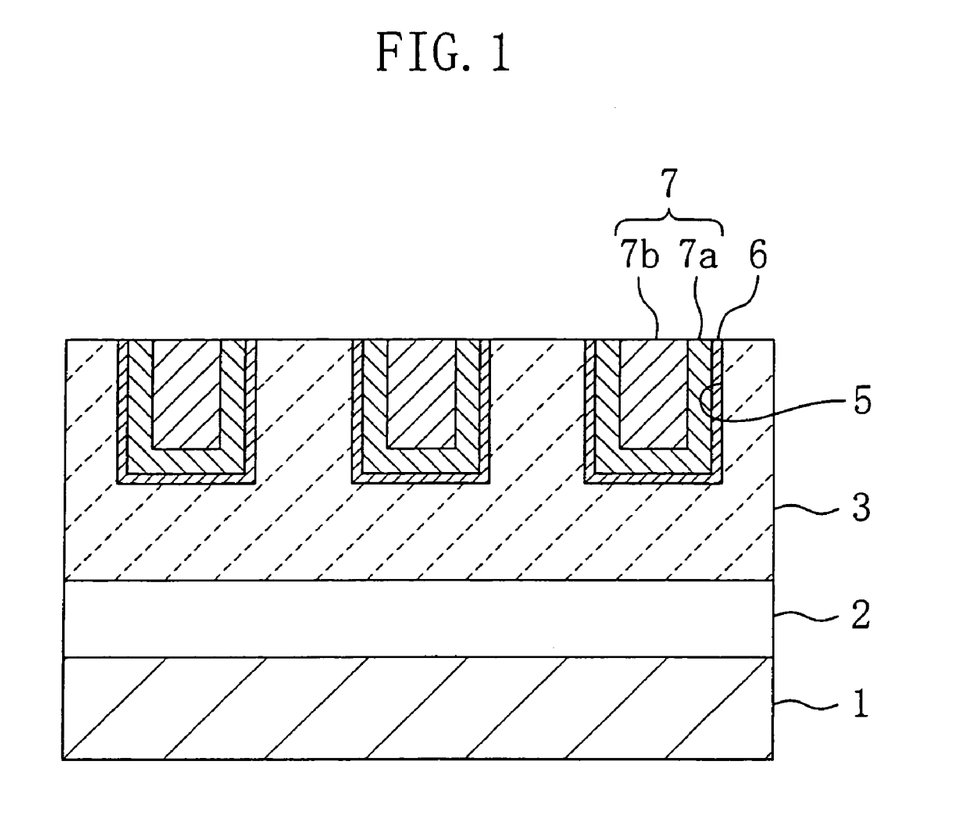
FIG. 1 is a cross-sectional view of a semiconductor device according to a first embodiment of the present invention.

FIG. 1 illustrates a cross-sectional structure of the semiconductor device according to the first embodiment. A first insulting film 2 of silicon dioxide is formed on a silicon substrate 1. And a second insulating film 3 of carbon-containing silicon dioxide is depositedl to a thickness of 1000 nm on the first insulating film 2 by a plasma CVD process or an SGO process, for example.

In the second insulating film 3, interconnect grooves 5 are formed And a silicon dioxide layer 6 is formed on the bottom and side faces of the interconnect grooves 5. The silicon dioxide layer 6 has a uniform thickness of about 20 nm or less, preferably between about 10 nm and about 15 nm, and a high density between about 2.0 $g/cm^3$ and about 2.1 $g/cm^3$.

On the silicon dioxide layer 6 inside the interconnect grooves 5, metal interconnects 7 are formed. Each of the interconnects 7 is made up of a barrier metal layer 7a of tantalum nitride and a main interconnect layer 7b of copper.

In the semiconductor device of the first embodiment, the silicon dioxide layer 6 with a uniform thickness of about 20 nm or less is formed on the bottom and side faces of the interconnect grooves 5. Therefore, a parasitic capacitance generated between the metal interconnects 7 is reduced significantly. Further, the silicon dioxide layer 6 can improve the adhesiveness of the second insulating film 3 of carbon-containing silicon dioxide to the metal interconnects 7. As a result, the adhesiveness of the interconnects 7 to the grooves 5 increases.

Furthermore, the silicon dioxide layer 6 with a high density between about 2.0 $g/cm^3$ and about 2.1 $g/cm^3$ is formed on the bottom and side faces of the interconnect grooves 5, thus allowing almost no oxygen to pass therethrough. Therefore, even if oxygen plasma is supplied in a subsequent process step, oxygen ions cannot pass through the silicon dioxide layer 6. Accordingly, the carbon-containing silicon dioxide film surrounding the silicon dioxide layer 6 is not oxidized, and the thickness of the silicon dioxide layer 6, formed on the bottom and side faces of the interconnect grooves 5, does not increase. As a result, the parasitic capacitance generated between the metal interconnects 7 can be reduced just as intended. This phenomenon is observed, for example, in the subsequent process step of ashing away a resist pattern for forming via holes over the metal interconnects 7. The phenomenon is also observed, for instance, in the subsequent process step of ashing away a resist pattern for forming interconnect grooves for upper-level metal interconnects to be formed over the via holes.

Embodiment 2

Hereinafter, a method for fabricating a semiconductor device according to a second embodiment of the present invention will be described with reference to FIG. 2A through FIG. 2F.

Figure 2A:
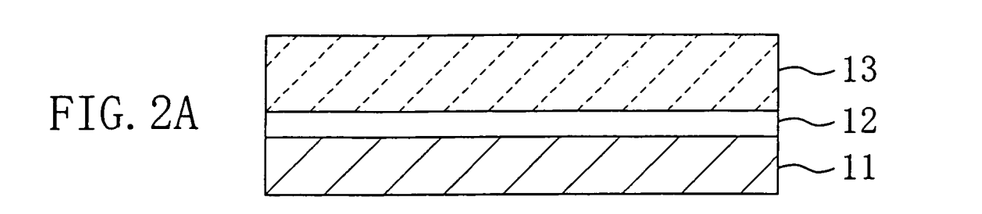
FIGS. 2A through 2F are cross-sectional views illustrating respective process steps for fabricating a semiconductor device according to a second embodiment of the present invention.

First, as shown in FIG. 2A, a first insulating film 12 of silicon dioxide is formed on a silicon substrate 11. And a second insulating film 13 is deposited on the first insulating film 12. The second insulating film 13 is formed of a carbon-containing silicon dioxide film with a thickness of 1000 nm by a plasma CVD process or an SOG process, for example.

Figure 2B:
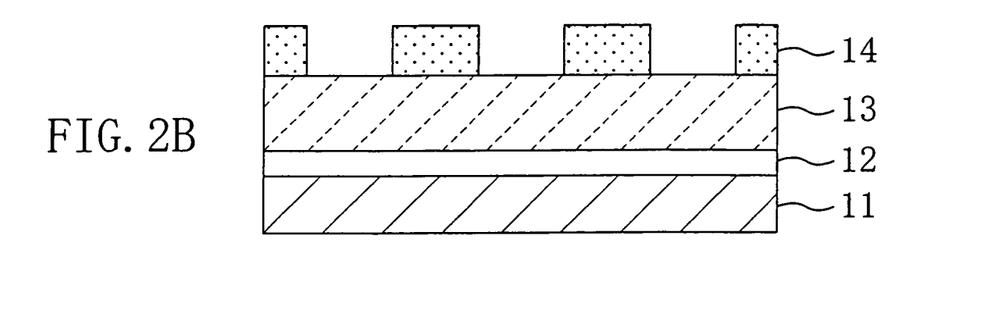

Next, the second insulating film 13 is coated with a resist film. Subsequently, the resist film is exposed to KrF excimer laser and patterned. Then, the patterned resist film is developed, thereby defining a resist pattern 14 with openings for forming interconnect grooves on the second insulating film 13 as shown in FIG. 2B.

Figure 2C:
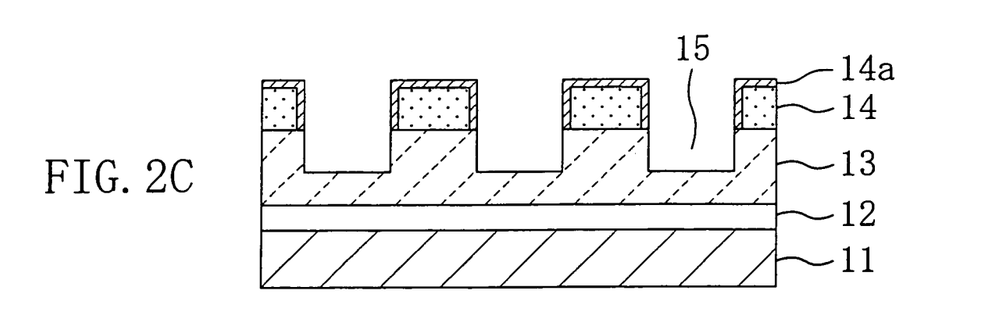

Subsequently, the second insulating film 13 is dry-etched with a plasma, thereby forming interconnect grooves 15 with a depth of about 500 nm in the second insulating film 13 as shown in FIG. 2C. Specifically, the plasma is created from an etching gas obtained by adding argon or oxygen gas to an etching gas consisting essentially of fluorine and carbon (e.g., gas containing at least one of $CF_4$ and $CHF_3$ gases). In this manner, the upper part of the resist pattern 14 changes into a cured layer 14a. Specifically, the bonding states of atoms in the cured layer 14a are different from those of atoms in the original material of the resist pattern 14, which has not yet been plasma-etched. And the cured layer 14a is made of a polymer consisting essentially of fluorine and carbon and has a thickness of about 50 nm.

Figure 2D:
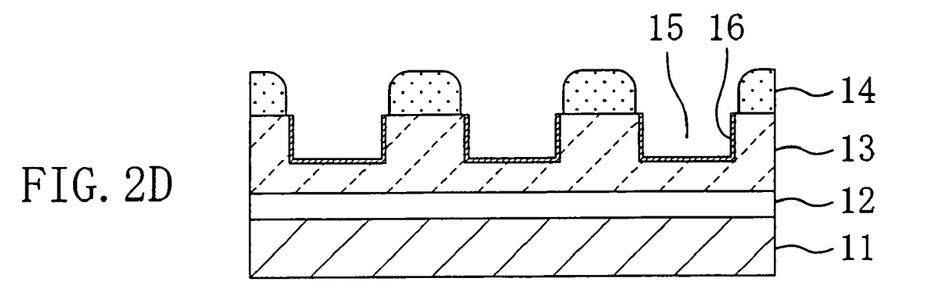

Next, as shown in FIG. 2D, the cured layer 14a is removed by a plasma etching process with oxygen gas. In this process step, the resist pattern 14 under the cured layer 14a is also removed slightly, but this will not cause a serious problem. Also, in this process step, the surface of the interconnect grooves 15 in the second insulating film 13 are also exposed to the oxygen plasma, thus forming a silicon dioxide layer 16 on the bottom and side faces of the interconnect grooves 15. However, the plasma etching process is performed using the oxygen gas just to remove the cured layer 14a only. Therefore, it takes a much shorter time to perform this plasma etching process than the plasma etching process for removing the resist pattern 14 entirely. Thus, oxygen ions in the plasma cannot go deeper into the second insulating film 13 of carbon-containing silicon dioxide through its surface. As a result, the thin silicon dioxide layer 16 is formed on the bottom and side faces of the interconnect grooves 15.

Hereinafter, it will be described what are the conditions of the plasma etching process using the oxygen gas.

In a first etching method, an etching process is performed for a short time by a down flow technique in a vacuum of 13.3 Pa or less so that the cured layer 14a is removed with most of the resist pattern 14 left. According to this method, oxygen ions in the plasma cannot go deeper into the second insulating film 13 of carbon-containing silicon dioxide through its surface. As a result, a silicon dioxide layer 16 with a thickness of about 20 nm or less is formed on the bottom and side faces of the interconnect grooves 15.

In a second etching method, an anisotropic RIE (reactive ion etching) process, in which a bias voltage is applied to the silicon substrate 11, is performed so that the cured layer 14a is removed with most of the resist pattern 14 left. According to this method, a silicon dioxide layer 16 with a high density between about 2.0 $g/cm^3$ and about 2.1 $g/cm^3$ and a thickness of about 20 nm or less is formed on the bottom and side faces of the interconnect grooves 15. In this case, if the anisotropic RIE process using the oxygen plasma is performed in a vacuum of 13.3 Pa or less, it is possible to form a silicon dioxide layer 16 with a high density between about 2.0 $g/cm^3$ and about 2.1 $g/cm^3$ and a thickness between about 10 nm and about 15 nm.

Figure 2E:
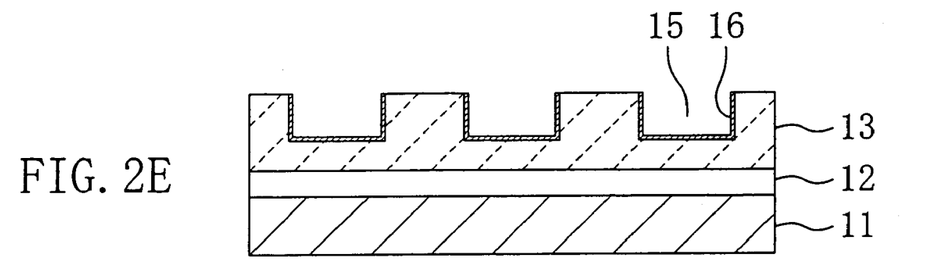

Next, the remaining part of the resist pattern 14 is removed by a wet etching process using a chemical solution that can dissolve the resist, e.g., a chemical solution containing amine, as shown in FIG. 2E.

Figure 2F:
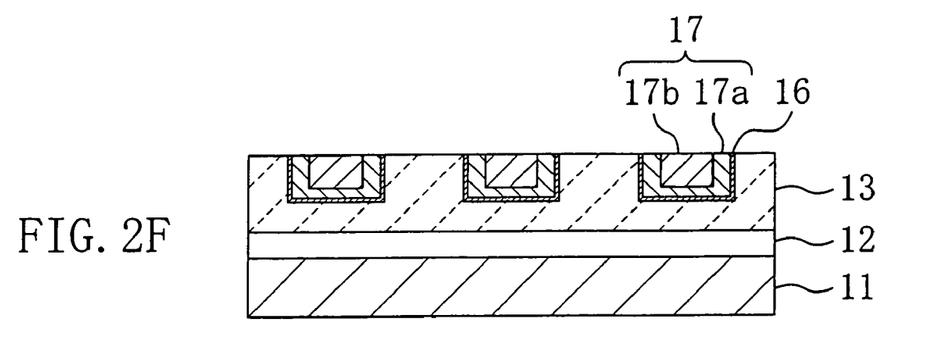

Subsequently, a tantalum nitride film is deposited over the second insulating film 13 as well as inside the interconnect grooves 15, or over the silicon dioxide layer 16 more exactly, by a sputtering process. Then, a copper film is deposited on the tantalum nitride film by an electroplating process. Thereafter, excessive parts of the copper and tantalum nitride films existing over the second insulating film 13, are removed by a CMP process. In this manner, metal interconnects 17 are formed inside the interconnect grooves 15 as shown in FIG. 2F. The metal interconnects 17 are made up of a barrier metal layer 17a of tantalum nitride and a main interconnect layer 17b of copper.

In the second embodiment, if the first etching method is used for the step of removing the cured layer 14a by the plasma etching process using the oxygen gas, a silicon dioxide layer 16 with a thickness of about 20 nm or less can be formed on the bottom and side faces of the interconnect grooves 15. That is to say, the thickness of the silicon dioxide layer 16 with a high dielectric constant can be reduced. As a result, a parasitic capacitance between the metal interconnects 17 can be reduced just as intended.

Also, in the second embodiment, if the second etching method is used for the step of removing the cured layer 14a by the plasma etching process with the oxygen gas, a silicon dioxide layer 16 with a high density between about 2.0 $g/cm^3$ and about 2.1 $g/cm^3$ and a thickness of about 20 nm or less can be formed on the bottom and side faces of the interconnect grooves 15. In this process, if an anisotropic RIE process is performed using the oxygen plasma in a vacuum of 13.3 Pa or less, a silicon dioxide layer 16 with a high density between about 2.0 $g/cm^3$ and about 2.1 $g/cm^3$ and a thickness between about 10 nm and about 15 nm can be formed.

According to the second etching method, an etching process is performed in a higher vacuum (at a lower pressure) using a substrate at lower temperature and the oxygen ions has a higher energy compared to a known ashing process using oxygen plasma. Therefore, a silicon dioxide layer 16 with a high density of 2.0 $g/cm^3$ or more can be formed. Thus, even if oxygen plasma is supplied in a subsequent process step, the oxygen ions cannot pass through the silicon dioxide layer 16, and the thickness of the silicon dioxide layer 16 does not increase. As a result, the parasitic capacitance generated between the metal interconnects 17 can be reduced just as intended.

Embodiment 3

Hereinafter, a method for fabricating a semiconductor device according to a third embodiment of the present invention will be described with reference to FIG. 3A through FIG. 3F.

Figure 3A:
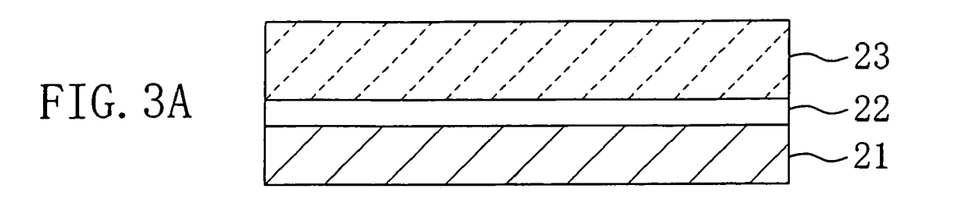
FIGS. 3A through 3F are cross-sectional views illustrating respective process steps for fabricating a semiconductor device according to a third embodiment of the present invention.
Figure 3B:
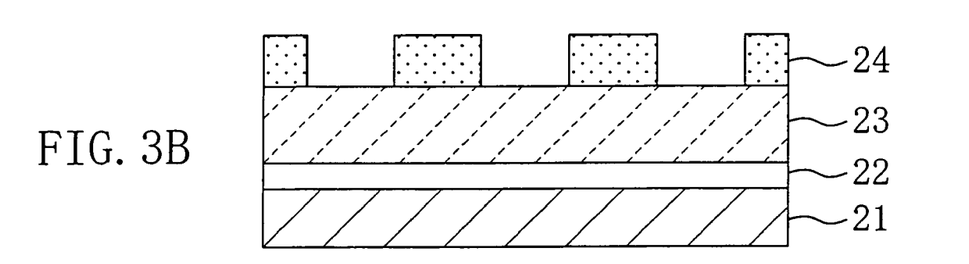

First, as shown in FIG. 3A, a first insulating film 22 of silicon dioxide is formed on a silicon substrate 21. And a second insulating film 23 is deposited on the first insulating film 22. The second insulating film 23 is formed of a carbon-containing silicon dioxide film with a thickness of 1000 nm by a plasma CVD process or an SOG process, for example. Then, a resist pattern 24 with openings for forming interconnect grooves is defined on the second insulating film 23 as shown in FIG. 3B.

Figure 3C:
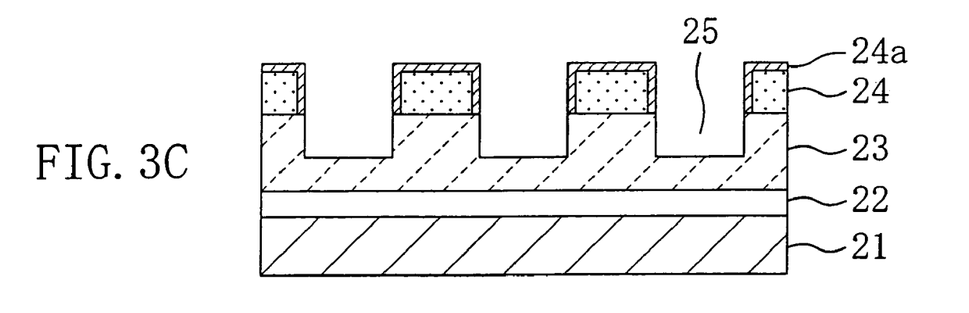

Subsequently, the second insulating film 23 is dry-etched with a plasma, thereby forming interconnect grooves 25 with a depth of about 500 nm in the second insulating film 23 as shown in FIG. 3C. Specifically, the plasma is created from an etching gas obtained by adding argon or oxygen gas to an etching gas consisting essentially of fluorine and carbon (e.g., at least one of $CF_4$ and $CHF_3$ gases). Then, the upper part of the resist pattern 24 changes into a cured layer 24a, which is made of a polymer consisting essentially of fluorine and carbon and has a thickness of about 50 nm.

Figure 3D:
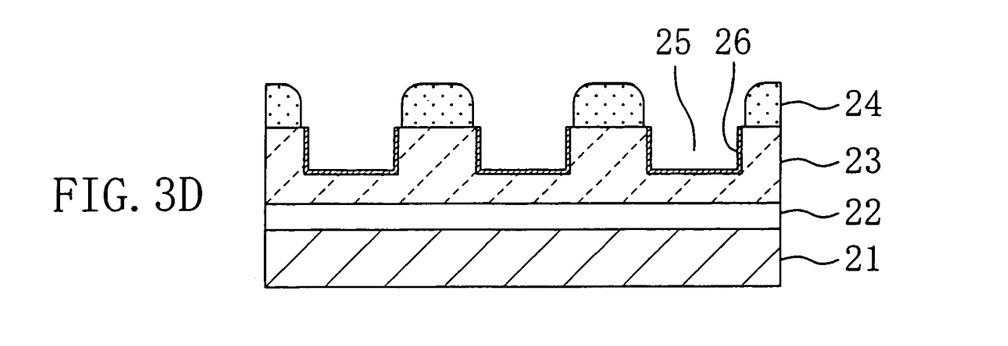

Next, as shown in FIG. 3D, the cured layer 24a is removed by a plasma etching process using oxygen gas. In this process step, the resist pattern 24 under the cured layer 24a is also removed slightly, but this will not cause a serious problem. Further, a thin silicon dioxide layer 26 is formed on the bottom and side faces of the interconnect grooves 25 in the second insulating film 23. The conditions of the plasma etching process using the oxygen gas are as described for the second embodiment, so the description thereof will be omitted herein.

Figure 3E:
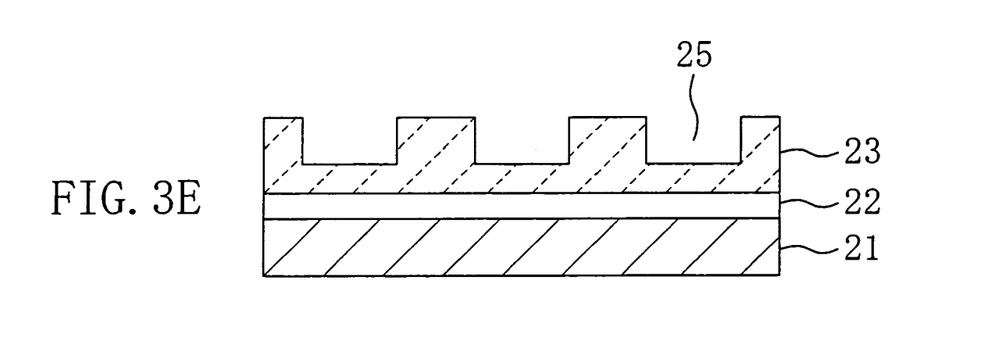

Thereafter, the remaining part of the resist pattern 24 is removed by a wet etching process using a chemical solution that can dissolve the resist, e.g., a chemical solution containing amine. Then, the silicon dioxide layer 26, formed on the bottom and side faces of the interconnect grooves 25, is removed by a wet etching process using a chemical solution that can remove the oxide film (e.g., a chemical solution containing ammonium fluoride) as shown in FIG. 3E.

Figure 3F:
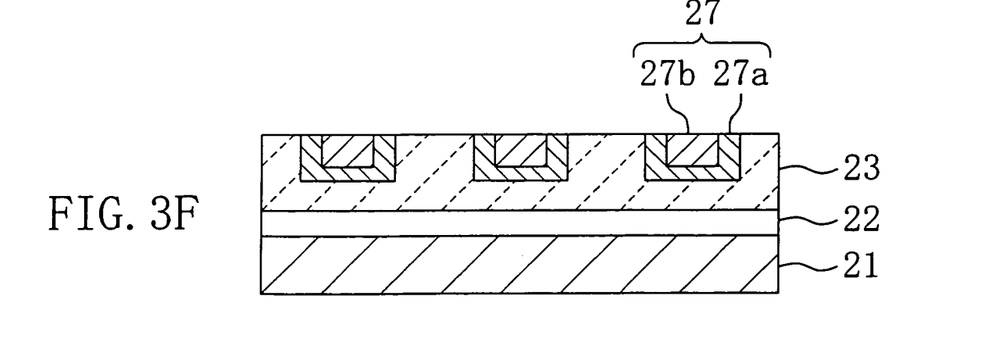

Next, a tantalum nitride film is deposited over the second insulating film 23 as well as inside the interconnect grooves 25 by a sputtering process. Then, a copper film is deposited over the tantalum nitride film by an electroplating process. Thereafter, excessive parts of the copper and tantalum nitride films, existing over the second insulating film 23, are removed by a CMP process, thereby forming metal interconnects 27 inside the interconnect grooves 25 as shown in FIG. 3F. The metal interconnects 27 are made up of a barrier metal layer 27a of tantalum nitride and a main interconnect layer 27b of copper.

According to the third embodiment, the silicon dioxide layer 26, existing on the bottom and side faces of the interconnect grooves 25, is removed and then the metal interconnects 27 are formed inside the interconnect grooves 25. That is to say, the silicon dioxide layer 26 no longer exists between the metal interconnects 27. As a result, a parasitic capacitance produced between the metal interconnects 27 can be reduced even more significantly.

Embodiment 4

Hereinafter, a method for fabricating a semiconductor device according to a fourth embodiment of the present invention will be described with reference to FIG. 4A through FIG. 4G.

Figure 4A:
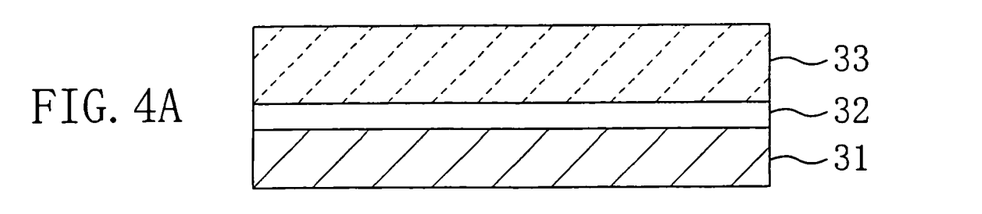
FIGS. 4A through 4G are cross-sectional views illustrating respective process steps for fabricating a semiconductor device according to a fourth embodiment of the present invention.
Figure 4B:
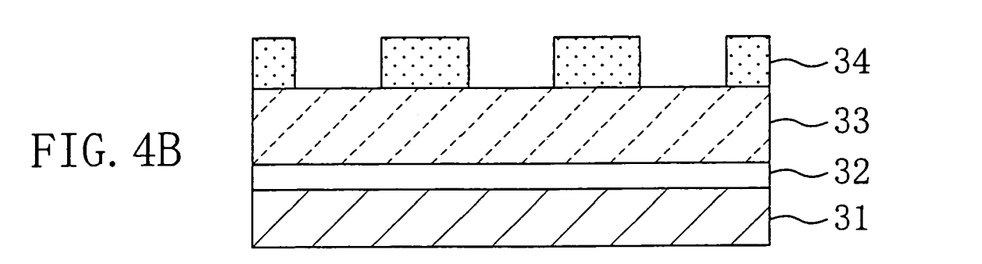

First, as shown in FIG. 4A, a first insulating film 32 of silicon dioxide is formed on a silicon substrate 31. And a second insulating film 33 is deposited on the first insulating film 32. The second insulating film 33 is formed of a carbon-containing silicon dioxide film with a thickness of 1000 nm by a plasma CVD process or an SOG process, for example. Then, a resist pattern 34 with openings for forming interconnect grooves is defined on the second insulating film 33 as shown in FIG. 4B.

Figure 4C:
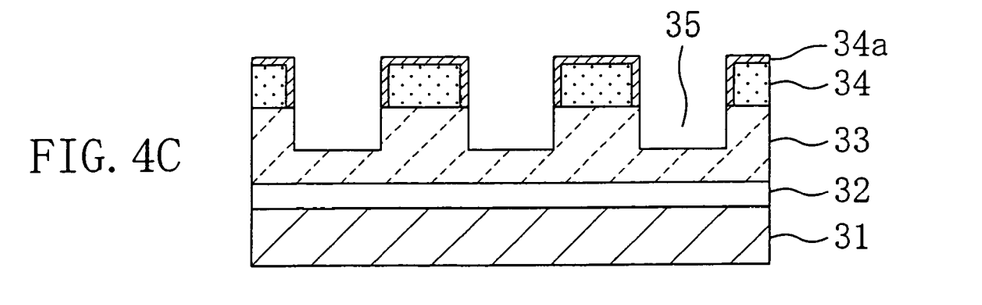

Subsequently, the second insulating film 33 is dry-etched with a plasma, thereby forming interconnect grooves 35 with a depth of about 500 nm in the second insulating film 33 as shown in FIG. 4C. Specifically, the plasma is created from an etching gas obtained by adding argon or oxygen gas to an etching gas consisting essentially of fluorine and carbon (e.g., gas containing at least one of $CF_4$ and $CHF_3$ gases). Then, the upper part of the resist pattern 34 changes into a cured layer 34a, which is made of a polymer consisting essentially of fluorine and carbon and has a thickness of about 50 nm.

Figure 4D:
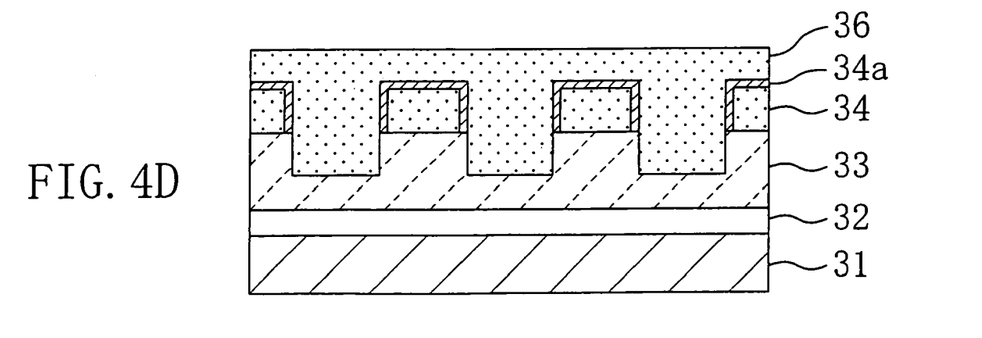

Next, as shown in FIG. 4D, a resist film 36 is deposited over the entire surface of the resist pattern 34 so that the interconnect grooves 35 are filled with the film 36.

Figure 4E:
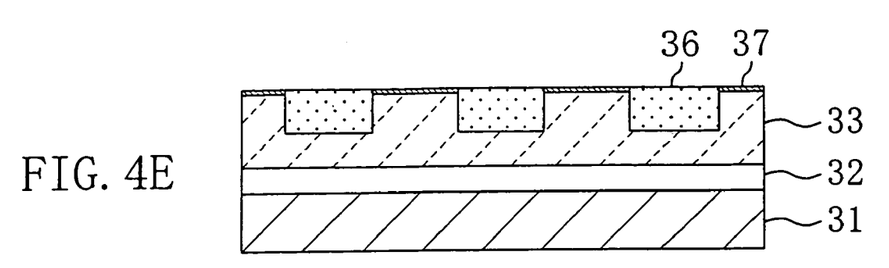

Thereafter, as shown in FIG. 4E, excessive part of the resist film 36, existing over the second insulating film 33, and the entire resist pattern 34 with the cured layer 34a in its upper part are ashed away with oxygen plasma. In this process step, the plasma etching process is performed using oxygen gas for a longer time than the second embodiment by a down flow technique in a vacuum of 13.3 Pa or less. As a result, the resist film 36 and resist pattern 34 are etched back. Also, after the resist pattern 34 has been removed, the upper surface (i.e., the surface other than the bottom and side faces of the interconnect grooves 35) of the second insulating film 33 of carbon-containing silicon dioxide is exposed to the oxygen plasma for just a short time. Accordingly, a thin silicon dioxide layer 37 is formed in the upper part of the second insulating film 33. On the other hand, no silicon dioxide layer is formed on the bottom and side faces of the interconnect grooves 35 because the interconnect grooves 35 are filled with the resist film 36.

Figure 4F:
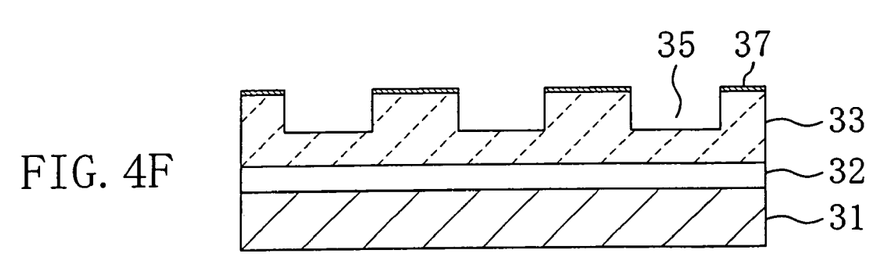

Subsequently, as shown in FIG. 4F, the resist film 36 in the interconnect grooves 35 is removed by a wet etching process using a chemical solution that can dissolve the resist, e.g., a chemical solution containing amine.

Figure 4G:
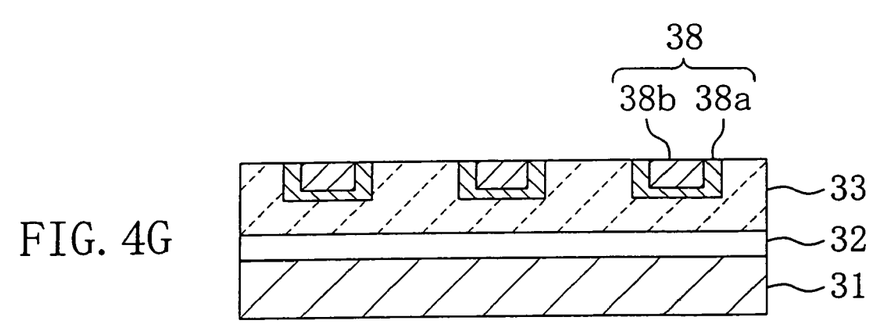

Next, a tantalum nitride film is deposited over the second insulating film 33 as well as inside the interconnect grooves 35 by a sputtering process. Then, a copper film is deposited on the tantalum nitride film by an electroplating process. Thereafter, excessive parts of the copper and tantalum nitride films, existing over the second insulating film 33, are removed by a CMP process, thereby forming metal interconnects 38 inside the interconnect grooves 35 as shown in FIG. 4G. The metal interconnects 38 are made up of a barrier metal layer 38a of tantalum nitride and a main interconnect layer 38b of copper. In this process step, the silicon dioxide layer 37 formed in the upper part of the second insulating film 33 is also removed by increasing the thickness of the portions removed by the CMP process.

According to the fourth embodiment, in the step of removing the resist pattern 34 with the oxygen plasma, no silicon dioxide layer is formed on the bottom and side faces of the interconnect grooves 35 because the interconnect grooves 35 are filled with the resist film 36. As a result, a parasitic capacitance, produced between the metal interconnects 38, can be reduced.

Modified Example of Embodiment 4

Hereinafter, a method for fabricating a semiconductor device according to a modified example of the fourth embodiment will be described with reference to FIG. 5A through FIG. 5D.

Figure 5A:
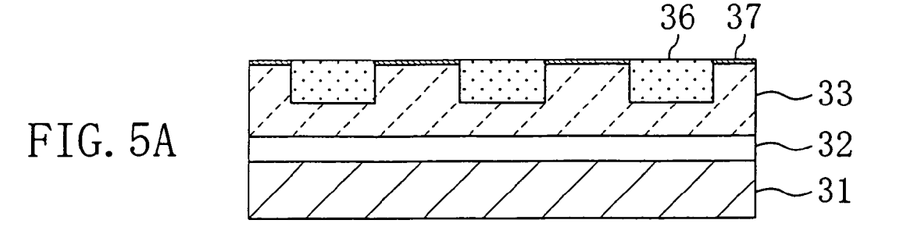
FIGS. 5A through 5D are cross-sectional views illustrating respective process steps for fabricating a semiconductor device according to a modified example of the fourth embodiment.

After the same process steps have been carried out as in the fourth embodiment, an ashing process is performed using oxygen plasma to remove excessive part of the resist film 36, existing over the second insulating film 33, and the entire resist pattern 34 with the cured layer 34a in its upper part as shown in FIG. 5A. In this process step, the plasma etching process is performed using the oxygen gas for a longer time than the second embodiment by a down flow technique in a vacuum of 13.3 Pa or less. Then, a first thin silicon dioxide layer 37 is formed in the upper part of the second insulating film 33 with no silicon dioxide layer formed on the bottom and side faces of the interconnect grooves 35 as in the fourth embodiment.

Figure 5B:
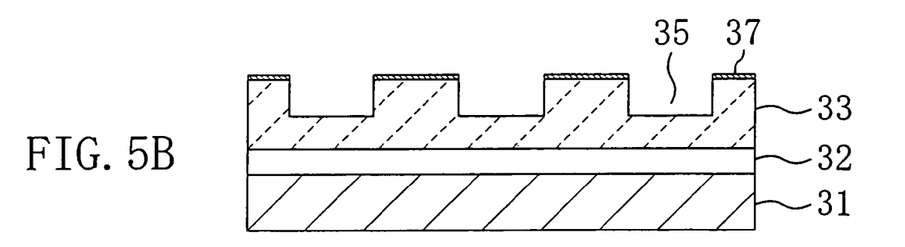

Next, as shown in FIG. 5B, the resist film 36 existing in the interconnect grooves 35 is removed by a wet etching process using a chemical solution that can dissolve the resist, e.g., a chemical solution containing amine.

Figure 5C:
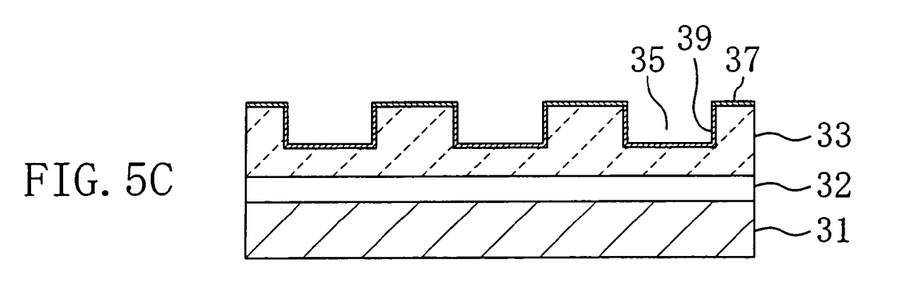

Subsequently, as shown in FIG. 5C, an anisotropic RIE process, in which a bias voltage is applied to the silicon substrate 31, is performed, thereby forming a second silicon dioxide layer 39 with a high density between about 2.0 g/cm$^3$ and about 2.1 g/cm$^3$ and a thickness of about 20 nm or less on the bottom and side faces of the interconnect grooves 35. In this process step, if the anisotropic RIE process is performed in a vacuum of 13.3 Pa or less, it is possible to form a second silicon dioxide layer 39 with a high density between about 2.0 g/cm$^3$ and about 2.1 g/cm$^3$ and a thickness between about 10 nm and about 15 nm. It should be noted that the first silicon dioxide layer 37, existing in the upper part of the second insulating film 33, has its density and thickness both increased by this anisotropic RIE process. However, this will not cause a serious problem because the first silicon dioxide layer 37 will be removed by the next CMP process.

Figure 5D:
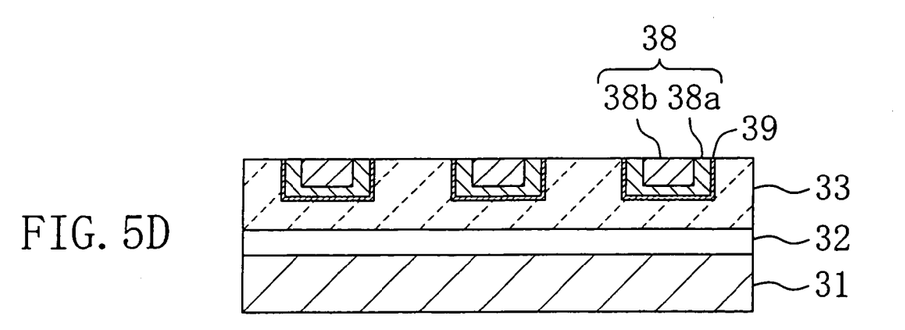

Thereafter, as shown in FIG. 5D, a tantalum nitride film is deposited by a sputtering process over the second insulating film 33 as well as inside the interconnect grooves 35 having the second silicon dioxide layer 39 formed thereon. Then, a copper film is deposited on the tantalum nitride film by an electroplating process. Thereafter, excessive parts of the copper and tantalum nitride films, existing over the second insulating film 33, are removed by a CMP process, thereby forming metal interconnects 38 inside the interconnect grooves 35, having the second silicon dioxide layer 39 formed thereon, as shown in FIG. 5D. The metal interconnects 38 are made up of a barrier metal layer 38a of tantalum nitride and a main interconnect layer 38b of copper. In this process step, the silicon first dioxide layer 37, existing in the upper part of the second insulating film 33, is also removed by increasing the thickness of the portions removed by the CMP process.

According to the modified example of the fourth embodiment, it is possible to form a second silicon dioxide layer 39 with a high density between about 2.0 g/cm$^3$ and about 2.1 g/cm$^3$ and a thickness of about 20 nm or less on the bottom and side faces of the interconnect grooves 35. Therefore, even if oxygen plasma is supplied in a subsequent process step, oxygen ions cannot pass through the second silicon dioxide layer 39. Accordingly, the thickness of the second silicon dioxide layer 39 does not increase. As a result, a parasitic capacitance produced between the metal interconnects 38 can be reduced just as intended.

What is claimed is:

1. A method for forming a semiconductor device, comprising the steps of:
   a) forming an insulating film of a carbon-containing silicon oxide film over a substrate;
   b) etching the insulating film using a resist pattern as a mask, thereby forming an interconnect groove in the insulating film;
   c) filling the interconnect groove with a resist film;
   d) performing an etching process, thereby removing a first region of the resist film, existing outside the interconnect groove, and the resist, pattern,
   e) removing a second region of the resist film, still existing inside the interconnect groove,
   f) depositing a metal film on the interconnect groove,
   g) filling the interconnect grove with the metal, followed by removing metal film outside the interconnect and a surface film of the insulating film.

2. The method of claim 1, further comprising a step of forming the surface film on the insulating film when the second region of the resist film inside the interconnect groove is removed.

3. The method of claim 1, wherein the etching process uses an etching gas containing oxygen.

4. The method of claim 1, wherein the etching process is carried out by a down flow technique in a vacuum of 13.3 Pa or less.

5. The method of claim 1, wherein the metal film is made up of a barrier metal layer and a main interconnect layer.

6. The method of claim 5, wherein the barrier metal is a tantalum nitride and the main interconnect layeris copper.

* * * * *

UNITED STATES PATENT AND TRADEMARK OFFICE
CERTIFICATE OF CORRECTION

PATENT NO. : 7,030,009 B2  Page 1 of 1
APPLICATION NO. : 10/942953
DATED : April 18, 2006
INVENTOR(S) : Hiroshi Yuasa It is certified that error appears in the above-identified patent and that said Letters Patent is hereby corrected as shown below:

In the claims:

Claim 1, column 12, line 19, "and the resist, pattern" should read --and the resist pattern--; and Claim 6, column 12, line 38, "layeris copper" should read --layer is copper--.

Signed and Sealed this

Nineteenth Day of September, 2006

JON W. DUDAS
*Director of the United States Patent and Trademark Office*